United States Patent [19]

Sumi et al.

[11] Patent Number: 4,844,772
[45] Date of Patent: Jul. 4, 1989

[54] LAMINATOR

[75] Inventors: Sigeo Sumi, Saitama; Fumio Hamamura, Kanagawa; Ichio Fukuda; Mitsuhiro Seki, both of Tokyo; Noriyasu Sawada, Saitama, all of Japan

[73] Assignee: Somar Corporation, Tokyo, Japan

[21] Appl. No.: 46,603

[22] Filed: May 7, 1987

[30] Foreign Application Priority Data

| May 7, 1986 | [JP] | Japan | 61-104391 |
| May 7, 1986 | [JP] | Japan | 61-104392 |
| May 7, 1986 | [JP] | Japan | 61-104393 |
| May 7, 1986 | [JP] | Japan | 61-104394 |
| Oct. 1, 1986 | [JP] | Japan | 61-234167 |

[51] Int. Cl.$^4$ .................................... B32B 31/20
[52] U.S. Cl. ................... 156/497; 156/522; 156/552; 156/555; 156/556
[58] Field of Search ............ 156/517, 521, 522, 552, 156/555, 556, 497

[56] References Cited

U.S. PATENT DOCUMENTS 4,585,509  4/1986  Obayashi .................. 156/522
4,717,441  1/1988  Seki et al. ................. 156/522

Primary Examiner—Caleb Weston
Attorney, Agent, or Firm—Sughrue, Mion, Zinn, Macpeak and Seas

[57] ABSTRACT

A laminator for cutting a continuous thin film in a predetermined size and laminating same over a substrate is disclosed which comprises a stationary laminator body; a thin film supply member for supplying the continuous thin film to the substrate; a temporary bonding member for temporarily bonding a leading end of the continuous thin film within a pathway of thin film supply; and a support member for supporting the thin film supply member and the temporary bonding member in such a manner that the thin film supply member and the temporary bonding member are movable toward or away from the substrate. The support member is mounted on the stationary laminator body. The laminator also includes a cutter for cutting the continuous thin film in a predetermined size. The cutter is secured to the laminator body in an area near the pathway of thin film supply between the thin film supply member and the substrate.

29 Claims, 11 Drawing Sheets

FIG. 11

LAMINATOR

BACKGROUND OF THE INVENTION

The present invention relates to a laminating technique and, in particular, to a technique that is effectively applied to a laminator of the type that cuts a continuous thin film to a predetermined size and laminates it over a substrate.

Printed circuit boards used in electronic equipment such as computers are formed by depositing a predetermined pattern of wires of conductive materials such as copper on one or both sides of an insulating substrate.

Printed circuit boards of this type can be manufactured by the following process: first, an assembly of a photosensitive resin layer (ie, photoresist) and a protective transparent resin film is laminated over an electro-conductive layer on the insulating substrate by thermocompression, and this step is commercially carried out with a device called a "laminator's"; a film with a wiring pattern is then superposed on the assembly and the photosensitive resin layer is exposed to light for a predetermined period of time through the patterned film and the transparent resin film; subsequently, the transparent resin film is stripped with a peeler and the exposed photosensitive resin layer is developed to form a mask pattern for etching; thereafter, the unwanted areas of the conductive layer are etched away and any residual photosensitive layer is removed to produce a printed circuit board having a predetermined wiring pattern.

The above-described process of manufacturing a printed circuit board necessarily involves the step of automatically laminating an assembly of a photoresist and a protective film over the conductive layer on the insulating substrate by thermocompression with a laminator. This step of thermocompression lamination generally proceeds as follows.

First, a continuous sheet of assembly that has been wound on the feed roller in the laminator is supplied to the substrate by means of a main vacuum plate. The surface of the main vacuum plate over which the assembly is supplied is provided with a plurality of suction holes through which the assembly is sucked onto the main vacuum plate as it is supplied to the substrate. The leading edge of the assembly being supplied to the substrate is temporarily bonded (by thermocompression) onto the conductive layer on the insulating substrate by means of a temporary bonding portion provided at the downstream end of the main vacuum plate. In order to enable the supply and temporary bonding of the assembly, the main vacuum plate is mounted on the laminator body via a support member that is movable toward or away from the substrate.

In the next step, the assembly with its leading edge bonded temporarily to the substrate is laminated over said substrate by means of a thermocompression roller. When a given amount of the assembly has been laminated over the substrate, it is cut with a cutting unit to a predetermined size corresponding to the substrate. The cutting unit is mounted on the support member together with the main vacuum plate.

Since the main vacuum plate and the cutting unit, each of which is a heavy-duty component, are mounted on the same support member, the prior art laminator has suffered from the disadvantage that a drive source (e.g. air cylinder) having a large capacity (driving capability) must be used to effect didplacement of the support member.

Also, in the prior art, in the delivery path of the thin film bonding apparatus, since the thermocompression rollers are moved, a substantial space is formed between the thermocompression rollers and the delivery rollers for delivering the substrate over which the thin films are laminated. Accordingly, in particular in case of delivery of a thin substrate, a leading end of the substrate is liable to be suspended downwardly before the delivery rollers. As a result, it is difficult or impossible to lead the substrate to the delivery rollers.

These and other problems to be solved by the present invention and the novel features thereof will become apparent by reading the following description in this specification in conjunction with the accompanying drawings.

SUMMARY OF THE INVENTION

A typical embodiment of the present invention which is disclosed herein may be briefly described as follows:

A laminator by which a continuous thin film is cut to a predetermined size and laminated over a substrate, wherein a thin film supply member for supplying said continuous thin film to the substrate and a temporary bonding member by which the leading edge of the thin film being supplied by said thin film supply member is bonded temporarily to the substrate are mounted on the laminator body via a support member that is movable toward or away from the substrate, a cutting unit for cutting said continuous thin film to a predetermined size being secured to the laminator body in an area near the pathway of thin film supply between said temporary bonding member and the substrate.

In the laminator shown above, the cutting unit is secured to the laminator body so that the weight of the support member is sufficiently reduced to enable it to be driven with a drive source of a small capacity of driving capability.

According to another aspect of the invention, there is provided a laminator by which a continuous thin film is cut to a predetermined size and laminated over a substrate, wherein a thin film supply member for supplying said continuous thin film to the substrate is mounted on a support member, said support member being mounted on the laminator body in such a manner that it is movable toward or away from the substrate, a thin film retaining member by which the portion of said continuous thin film to be cut is retained within the pathway of thin film supply being also mounted on said support member, the continuous thin film retained on said thin film retaining member being cut to a predetermined size with a cutting unit, said cutting unit being secured to the laminator body in an area near the pathway of thin film supply between said thin film supply member and said substrate.

In the laminator shown above, both the thin film supply member and the thin film retaining member are mounted on the support member, and while the thin film is retained on the thin film supply member it is retained by the thin film retaining member to be situated on the proper position for cutting with the cutting unit. Because of this arrangement the thin film between the thin film supply member and the thin film retaining member will not slack in any part thereof and the cutting position of the thin film can be brought into exact alignment with that of the cutting unit. In addition, the cutting unit is secured to the laminator body, so that the weight of the support member is sufficiently reduced to enable it to be driven with a drive source of a small capacity or driving capability.

The fact that the cutting position of the thin film can be brought into exact alignment with that of the cutting unit has the additional advantage of allowing the thin film to be cut for the correct dimensions and thereby increasing the yield of acceptable products.

Also, according to the present invention, there is provided a laminator for laminating a thin film over a substrate, which comprises: a delivery roller means for delivering a substrate in a predetermined delivery path; a bonding roller means for bonding the thin film over said substrate; and a substrate guide means for guiding the substrate from the bonding roller means to the delivery roller means. The substrate guide means being located between the bonding roller means and the bonding roller means.

According to the present invention, it is possible to avoid the suspension of the leading end portion of the substrate after the bonding operation of the thin film onto the substrate. This is available particularly in case of thin substrates. Since the leading end of the substrate may be led to the subsequent delivery rollers without fail, any trouble is not caused in the delivery path.

BRIEF DESCRIPTION OF THE DRAWINGS

FIG. 11 is an enlarged diagrammatic representation of the essential components of the laminator shown in FIG. 8.

DESCRIPTION OF THE PREFERRED EMBODIMENTS

Embodiments of the present invention in which it is applied to a laminator for thermocompression laminating an assembly of a photosensitive resin layer and a transparent resin film onto a printed circuit board is hereinafter described specifically with reference to the accompanying drawings.

In the accompanying drawings intended for illustrating rating the first embodiment, components that achieves the same functions are identified by the same numerals and redundant explanation of such components will be omitted.

Figure 1:
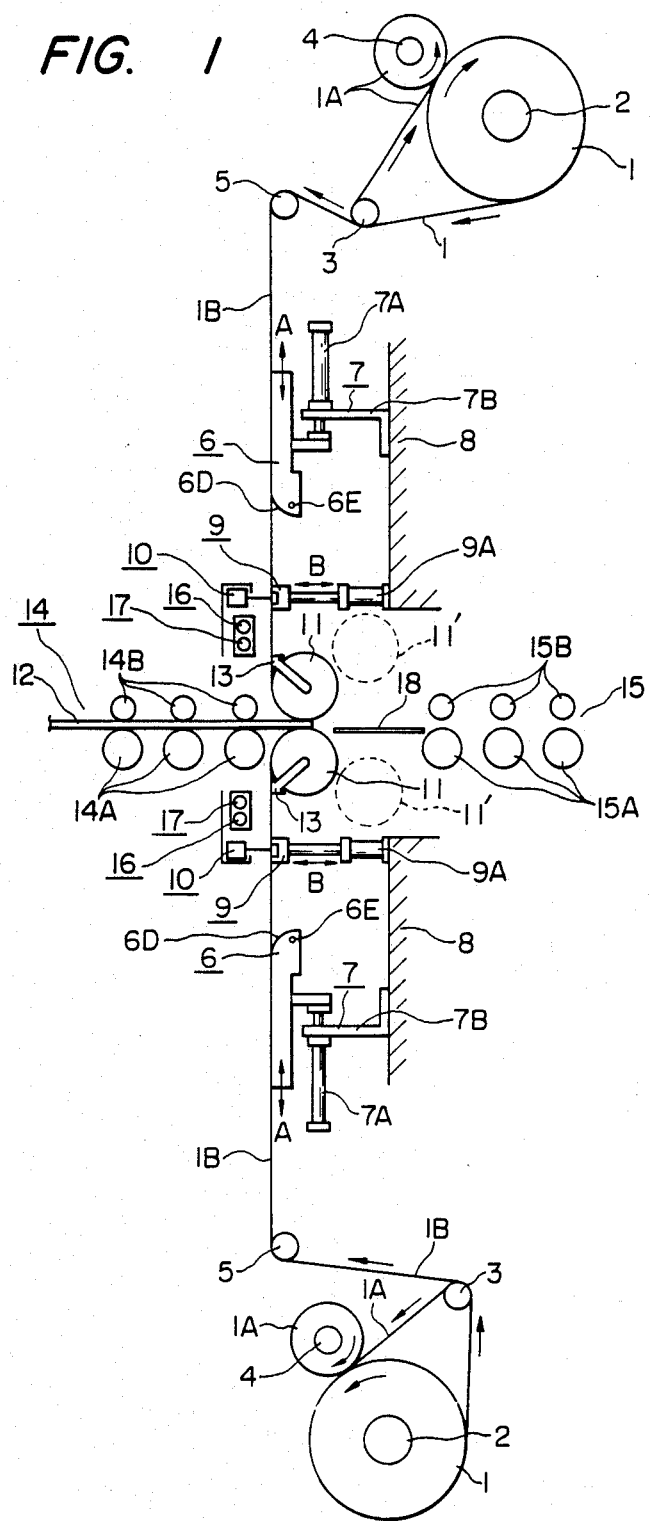
FIG. 1 is a schematic view of a laminator according to a first embodiment of the present invention.
Figure 2:
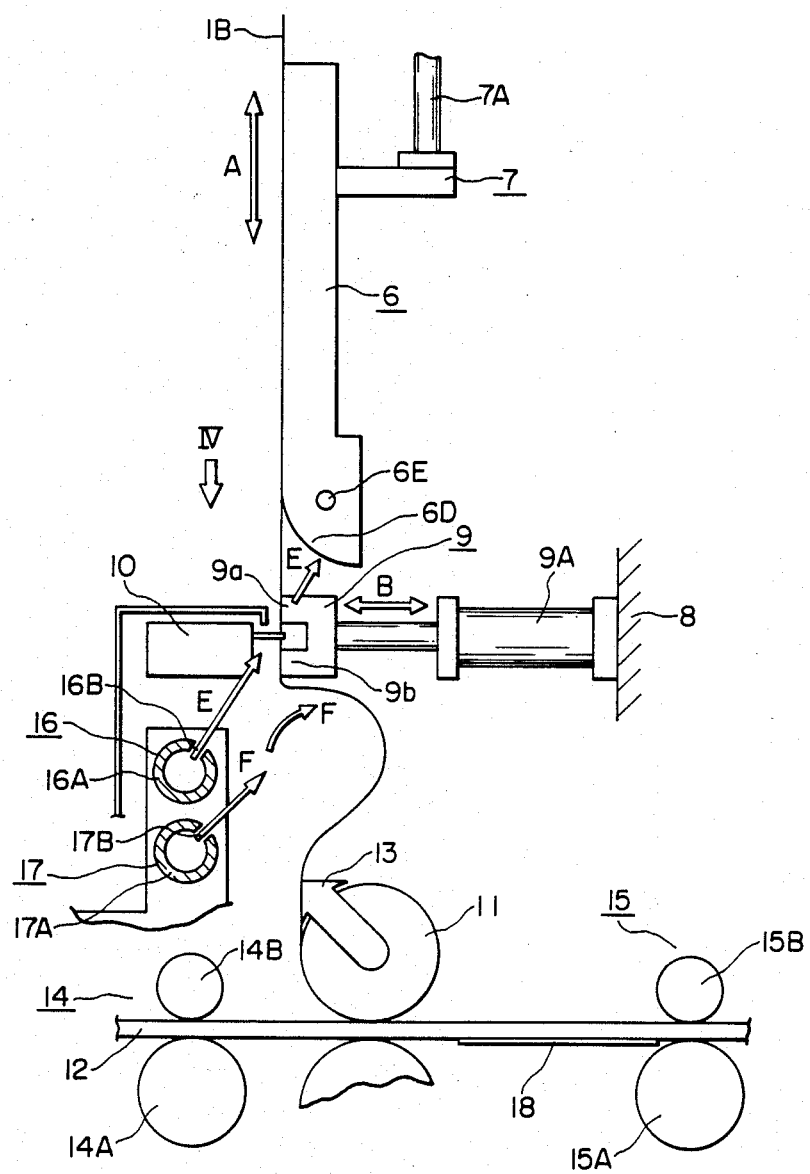
FIG. 2 is an enlarged diagrammatic representation of the essential components of the laminator shown in FIG. 1.

A laminator according to the first embodiment of the present invention is shown schematically in FIG. 1 and in FIG. 2 which is an enlarged schematic view of the essential components of FIG. 1.

As shown in FIGS. 1 and 2, an assembly 1 of three layers, ie, a transparent resin film a photosensitive resin layer, and another transparent resin film, is continuously supplied from a feed roller 2 to a peeling roller 3 by which it is separated into one transparent resin film (protective film) 1A and an assembly 1B composed of a photosensitive resin layer with its adhesive surface exposed and the other transparent resin film. The transparent resin film 1A is wound onto a takeup roller 4.

The leading edge of the assembly 1B that has been separated from the protective film 1A will pass on a tension roller 5 to be sucked onto a main vacuum plate 6. The tension roller 5 is so designed that it will impart an appropriate amount of tension to the assembly 1B as it is supplied from the feed roller 2 to the main vacuum plate 6. In other words, the tension roller 5 serves to keep the assembly 1B taut without developing any surface detects such as wrinkles.

The main vacuum plate (film supply member) 6 is so designed that it allows the assembly 1B to be supplied from the roller 2 onto an electroconductive layer on the surface of an insulating substrate 12. The main vacuum plate 6 is supported on the laminator body (housing of the laminator) 8 via a support member 7 that is movable toward or away from the insulating substrate 12 (viz., the support member 7 moves in the direction indicated by arrow A). The support member 7 is composed of a drive source 7A which may be formed of an air cylinder for displacing the main vacuum plate 6, and a supporting portion 7B for supporting the drive source 7A on the laminator body 8. In place of an air cylinder, the drive source 7A may be formed of a hydraulic or electro-magnetic cylinder, or a combination of a stepping motor and a transmission mechanism that transmits the displacement of the motor to the main vacuum plate 6.

Figure 3:
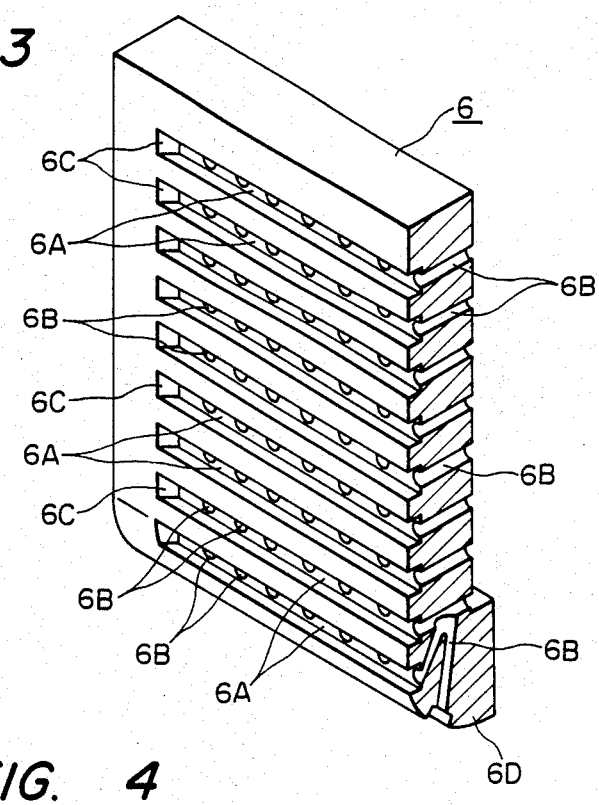
FIG. 3 is a perspective view of a partial section of the main vacuum plate shown in FIG. 1.

FIG. 3 is a perspective view of a partial section of the main vacuum plate 6. As shown, the plate 6 is provided with a plurality of grooves 6A that extend transversally in a direction generally orthogonal to the direction of supply of the assembly 1B and which are arranged in the direction in which the assembly 1B is conveyed. The length of each groove 6A as measured in the direction transversal to the direction in which the assembly 1B is supplied is generally the same as the dimension of the assembly 1B as measured in that transversal direction, so that the assembly 1B will cover each groove 6A. The bottom of each groove 6A is provided with a plurality of suction holes 6B by way of which the assembly 1B is to be sucked onto the main vacuum plate 6. Although not shown, each suction hole 6B is connected through an exhaust pipe to a vacuum source such as a vacuum pump. Both ends 6C of each groove 6A are tapered from the margin of the main vacuum plate 6 toward its center. The tapered ends 6C are so designed that the ends of the assembly 1B will be positioned in registry therewith when it is sucked onto the main vacuum plate 6.

The tapered ends 6C serve the following two purposes: first, they provide enhanced sucking of the assembly 1B by ensuring a maximum area in which it is sucked into grooves 6A; secondly, any small offset in the position on which the assembly 1B is sucked in the grooves 6A can be absorbed by the tapered ends 6C which provide sufficient air drag to prevent the margins of the assembly 1B from becoming slipped out of engagement with said tapered ends and thereby permit the assembly 1B to be sucked in the grooves 6A in a more reliable manner.

The downstream end of the main vacuum plate 6 as seen in the direction in which the assembly 1B is supplied is provided with a temporary thermocompression bonding portion 6D that has an arc-shaped surface to which the assembly 1B is to be sucked. This bonding portion 6D is formed as an integral part of the main vacuum plate 6. As shown in FIGS. 1 and 2, a heater 6E is provided in the interior of the bonding portion 6D as a means for heating its arc-shaped portion. The bonding portion 6D is so constructed that by this area the leading edge of the assembly 1B being supplied on the main vacuum plate 6 is bonded temporarily to the substrate 12 with heat and pressure.

In the present invention, the main vacuum plate 6 and temporary bonding portion 6D may be formed as separate members which are individually mounted on the laminator body 8 via the support member 7.

A sub-vacuum plate 9 is provided in the laminator body 8 in an area near the temporary bonding portion 6D, namely in the vicinity of the pathway of supply of assembly 1B between that portion and the substrate 12. Although not shown, the sub-vacuum plate 9 is also provided with suction holes and it is composed of an upper sucking portion 9a and a lower sucking portion 9b to provide a U-shaped form. The upper sucking portion 9a of the sub-vacuum plate 9 chiefly serves to have the leading edge of the assembly 1B sucked so that it is sucked (and retained) on the temporary bonding portion 6D. In order to enable the leading edge of the assembly 1B to be sucked onto the bonding portion 6D, the sub-vacuum plate 9 is mounted on the laminator body 8 and operated with a drive source 9A which may be in the form of an air cylinder that is movable toward or away from the pathway of the supply of assembly 1B (ie, moved in the direction of arrow B).

The lower sucking portion 9b of the sub-vacuum plate 9 is so constructed that after a continuous form of assembly 1B has been cut with a cutting unit 10, the resulting segment of assembly is sucked at its trailing edge and retained within the pathway of the supply of assembly 1B. This lower sucking portion 9b is also constructed in such a way that after the start of thermocompression lamination, a slack will form in that portion of the assembly 1B which is situated between 9b and a rotary vacuum plate 13 (namely, a slack assembly 1B' will be formed). The slack assembly 1B' can be formed by supplying the assembly 1B on the main vacuum plate 6 at a speed that is so controlled as to be faster than the peripheral speed of a thermocompression roller 11 (viz., the speed of thermocompression lamination). For instance, if the peripheral speed of thermocompression roller 11 is set to be constant, the speed at which the assembly 1B is supplied on the main vacuum plate 6 will be set to a higher value than this peripheral speed. Although not shown, the speed at which the assembly is supplied on the main vacuum plate 6 and the peripheral speed of the roller 11 are controlled by a sequence control circuit.

As in the case of drive source 7A, the drive source 9A for sub-vacuum plate 9 may be in the form of a hydraulic cylinder or the like in place of an air cylinder.

The cutter unit 10 is provided in the laminator body (or a front-stage substrate conveyor 14) in an area near the pathway of the assembly 1B that is supplied from the temporary bonding portion 6D to the substrate 12. Stated more specifically, the cutter unit 10 is disposed to face the sub-vacuum plate 9 with the assembly 1B being positioned therebetween. The cutter unit 10 is so constructed that the assembly 1B which is continuously supplied on the main vacuum plate 6 is cut to a predetermined length in accordance with the dimensions of the substrate 12.

Figure 4:
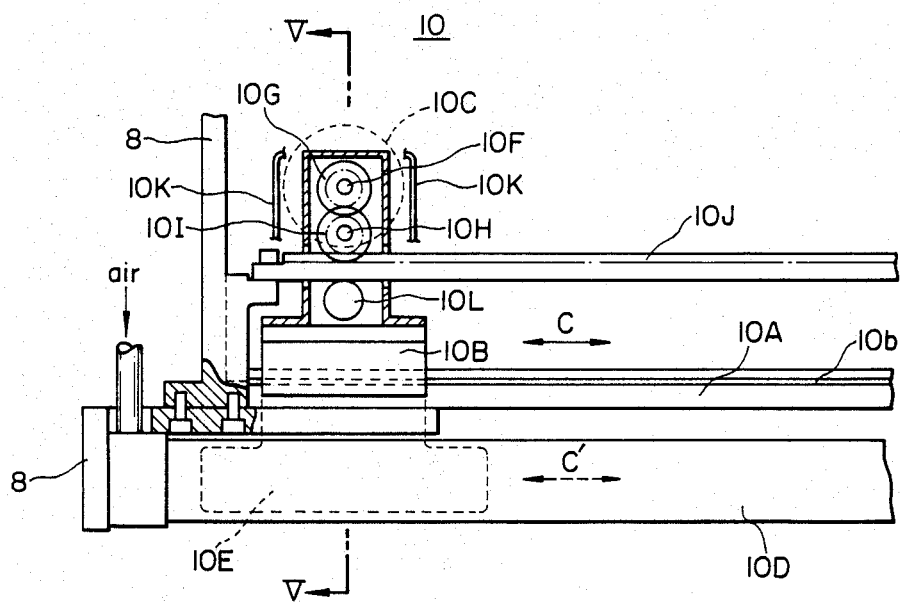
FIG. 4 is a diagrammatic plan view of the laminator looking in the direction of arrow IV in FIG. 2.
Figure 5:
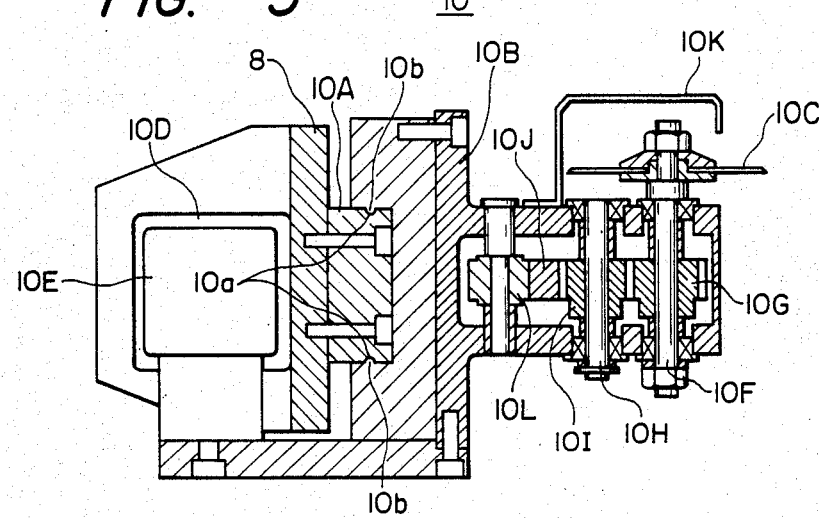
FIG. 5 shows the essential components of the laminator in section as taken on line V—V in FIG. 4.

The construction of the cutter unit 10 is specifically shown in FIG. 4 which is a schematic plan view of this cutter unit looking in the direction of arrow IV in FIG. 2, and in FIG. 5 which shows a section of the cutter unit as taken on line V—V in FIG. 4.

As is apparent from FIGS. 4 and 5, the cutter unit 10 is chiefly composed of a guide member 10A, a moving member 10B and a disk-shaped cutter 10C.

The guide member 10A extends transversal to the direction in which the assembly 1B is supplied and one or both ends of the member 10A are secured to the laminator body 8 by such fastening means as screws, bolts, nuts, and adhesives. In order to ensure correct movement of the moving member 10B in the direction transversal to that of the supply of assembly 1B (ie, the direction of arrow C in FIG. 4), the guide member 10A is provided with recesses (or projections) 10a that engage correspondingly shaped projections (or recesses) 10b formed on the moving member 10B.

The moving member 10B is so constructed that it will slide along the guide member 10 transversely to the direction in which the assembly 1B is supplied. This moving member 10B is connected to a slider 10E that will move in the direction of arrow C' within a hollow tube 10D that extends along the guide member 10A and which is supported at both ends to the laminator body 8. Movement of the slider 10E is effected by blowing a fluid such as air into the hollow tube 10D, or drawing such a fluid from the tube, through either end thereof. In other words, the slider 10E will be moved from left to right in FIG. 4 when a fluid is blown into the hollow tube 10D from its left side, and will be moved in opposite direction when the fluid is blown from the right side. The slider 10E is so designed as to displace the moving member 10B. In place of air, a gas such as an inert gas or a liquid such as water or oil may be blown into the hollow tube 10D. Alternative means for effecting displacement of the moving member 10B include an air cylinder, a hydraulic cylinder and a motor.

The disk-shaped cutter 10C is rotated as the moving member 10B is displaced and at least its periphery is provided with a blade for cutting the assembly 1B. The force to rotate the disk-shaped cutter 10C is imparted by the combination of a pinion 10G on an axis 10F and a gear wheel 10I on an axis 10H that meshes with a rack 10J. One or both ends of the rack 10J are secured to the laminator body 8. The engagement between the rack 10J and the gear wheel 10I is stabilized by means of a retainer roller 10L that is mounted on the moving member 10B.

The disk-shaped cutter 10C is made of a metallic material such as a high-speed tool steel and at least the surface of the blade is coated with polytetrafluoroethylene. Polytetrafluoroethylene is highly inert to chemicals and has superior heat stability; in addition, this resin has a small coefficient of friction and will not readily adhere to other materials. In laminators of the type contemplated by the present invention, repeated cutting of the assembly 1B will produce shavings that are composed of tiny particles and which contain various chemicals. If such shavings adhere to the blade of the disk-shaped cutter 10C, its cutting performance will easily deteriorate. This problem can be effectively solved by coating a film of polytetrafluoroethylene on the blade surface.

The moving member 10B in the neighborhood of the disk-shaped cutter 10C is provided with a protective cover 10K over the cutter 10C that is chiefly intended to ensure utmost safety for the operating personnel.

The cutting unit 10 described above is so constructed that in response to the sliding of the moving member 10B along the guide member 10A in one direction, the disk-shaped cutter 10C is rotated to cut the assembly 1B to a size that corresponds to the length of the insulating substrate 12. The assembly 1B can be cut by moving the disk-shaped cutter 10C in one direction and this enables rapid cutting of the assembly 1B.

In the above-described laminator of the present invention, the main vacuum place 6 and temporary bonding portion 6D are mounted on the laminator body 8 via. the support member 7 that is movable toward or away from the substrate 12, and the cutting unit 10 for cutting the assembly 1B is secured to the laminator body 8 in an area near the pathway of supply of the assembly 1B between the temporary bonding portion 6D and the substrate 12. This arrangement is effective in reducing the weight of the members to be supported by the support member 7 and thereby allowing it to be driven with the drive source 7A that may have a small driving capability (or capacity).

The above-described arrangement is also effective in reducing the numbers that have to be supported by the support member 7 and thereby simplifying the layout of the support member 7 and associated components thereof so as to reduce the overall size of the laminator.

The reduction in the size of drive source 7A and other components offers the additional advantage of decreasing the production cost of the laminator.

The cutting unit 10 which achieves its function by moving the disk-shaped cutter 10C may be in the form of a beam cutter that employs an appropriate means such as ultrasonic waves or a laser beam. Alternatively, the cutting unit 10 may be in the form of a cutter, such as a guillotine cutter, a band-shaped cutter, a wire-shaped cutter (which may or may not be heated) or a knife-shaped cutter, that has a blade extending transversely to the direction of supply of the assembly 1B and which is generally equal to or larger than the transversal dimension of the assembly 1B. Whichever type of cutter may be chosen, the cutting unit 10 is capable of cutting through the desired area of the assembly in a single action.

The assembly 1B whose leading edge has been temporarily thermocompression bonded to the conductive layer on the insulating substrate 12 by means of the temporary bonding portion 6D of the main vacuum plate 6 is subsequently laminated over the substrate 12 by thermocompression with the roller 11. When the leading edge of the assembly 1B is being bonded temporarily to the conductive layer by means of the temporary bonding portion 6D, the thermocompression roller 11 is rotating on the position indicated by the dashed line 11' in FIG. 1. Therefore, the roller 11 is so constructed that it will not come in contact with the bonding portion 6D during the temporary bonding operation. After the temporary bonding operation, the roller 11 will be shifted from the position indicated by the dashed line 11' to the position indicated by the solid line, or where the insulating substrate 12 carrying the assembly 1B on both sides is held between upper and lower thermocompression rollers 11. The rollers 11 will then rotate in the direction indicated by arrow D in FIG. 2 such that they will convey the insulating substrate 12 as the assembly 1B is thermocompression laminated over the conductive layer on each side of the substrate. As long as the step of thermocompression lamination is being carried out, the mode of sucking the assembly 1B onto the main vacuum plate 6 or sub-vacuum plate 9 is turned off, and the assembly 1B is automatically supplied from the feed roller 2 by the rotating force of the rollers 11 and the retaining force provided by these rollers and the substrate 12.

Figure 6:
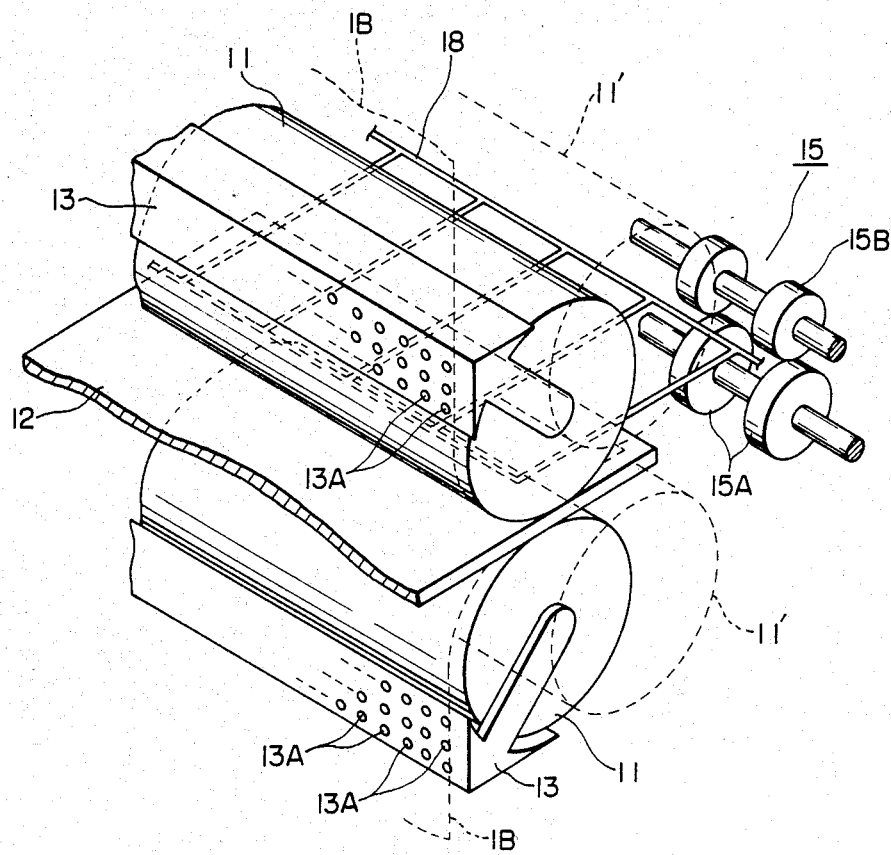
FIG. 6 is a perspective view of the essential components of the thermocompression rollers and the substrate guide member shown in FIGS. 1 and 2.

The trailing edge of the assembly 1B that has been cut with the cutting unit 10 will be guided by a triangular rotary vacuum plate 13 such that it will not develop any wrinkles or other surface defects and that it will be correctly thermocompression laminated with the rollers 11. As shown in FIG. 6, the rotary vacuum plate 13 is rotatably supported on the shaft of each thermocompression roller 11 and a plurality of suction holes 13A are provided in the sucking surface of the plate 13 which is in contact with the assembly 1B. The sucking surface provided with the suction holes 13A is constructed in the same manner as the sucking surface of the main vacuum plate 6 shown in FIG. 3. Although not shown, suction holes may also be provided in the top surface of the rotary vacuum plate 13 and this layout has the advantage of providing a slack assembly 1B' of the shape shown in FIG. 2.

The substrate 12 is conveyed to the temporary bonding position of the laminator by means of the front-stage conveyor 14 that is composed of lower transport rollers 14A and upper transport rollers 14B. After the assembly 1B has been laminated over the substrate 12 by means of rollers 11 in the laminator, the substrate will be conveyed to an exposure unit (for producing a patterned wiring) with a rear-stage conveyor 15 that is composed of lower transport rollers 15 and upper transport rollers 15B.

A thin film adjusting unit 16 is provided on the laminator body (or front-stage conveyor 14 or support member 7) in an area near the pathway of thin film supply, or the pathway of the movement of the temporary bonding portion 6D of the main vacuum plate 6. The adjusting unit 16 is so constructed that it will adjust the leading edge of the assembly 1B to be supplied in a direction in which it will come into intimate contact with the temporary bonding portion 6D. As shown specifically in FIGS. 2 and 7, adjuster 16 is composed of a fluid conveying pipe 16A that extends transversely to the direction in which the assembly 1B is supplied and a plurality of fluid blowing holes 16B made in this pipe 16A.

The fluid conveying pipe 16A has a hollow interior and will permit the passage of a fluid therethrough at a pressure higher than one atmosphere. In the embodiment under discussion, the fluid conveying pipe 16A is shown to have a generally circular cross section but the cross-sectional shape of this pipe is not limited to a circle and may be rectangular or elliptical.

Figure 7:
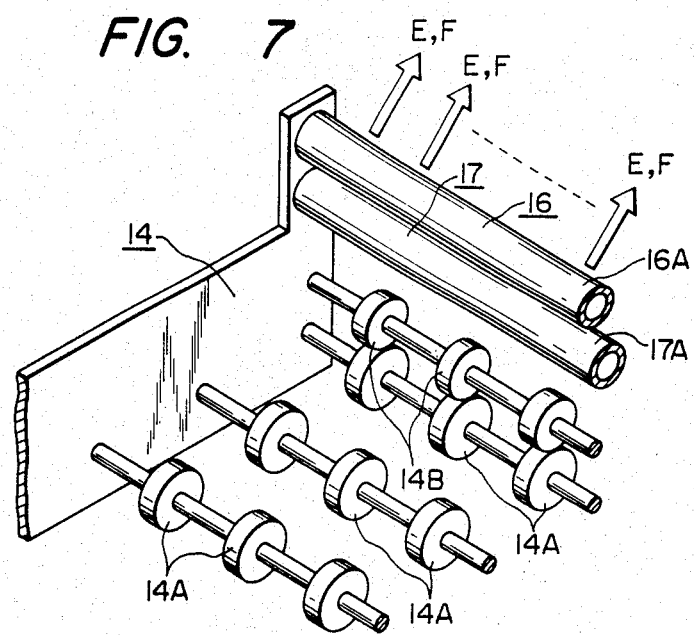
FIG. 7 is a perspective view of the essential components of the thin film adjusting unit and the thin film projecting unit shown in FIGS. 1 and 2.

The fluid blowing holes 16B are disposed in such a manner that a fluid will be blown against the assembly 1B in a direction that ensures proper adjustment of the assembly 1B (ie, in the direction of arrow E in FIGS. 2 and 7).

Air is typically used as a fluid in the film adjuster 16). Alternatively, gases such as inert gases or liquids such as water and oil may be used as fluids.

As described above, in the laminator of the present invention, the thin film adjusting unit 16 which adjusts the leading edge of the assembly 1B to be supplied in a direction in which it is brought into intimate contact with the temporary bonding portion 6D of the main vacuum plate 6 is mounted in the laminator body (or support member 7 or front-stage conveyor 14) in an area near the pathway of the movement of the bonding portion 6D. This arrangement assures the leading edge of the assembly 1B to be brought into intimate contact with the bonding portion 6D so that said leading edge can be temporarily thermocompression bonded onto the conductive layer on the insulating substrate 12 in a reliable manner.

A thin film projecting unit 17 is mounted in the laminator body 8 (or front-stage conveyor 14 or support member 7) in an area near the assembly 1B (or 1B') that is supplied between the lower sucking portion 9b of the sub-vacuum plate 9 and the rotary cacuum plate 13. This projecting unit 17 is so constructed that it will form the slack assembly 1B' in a direction in which it will be brought into intimate contact with the thermocompression roller 11. As shown specifically in FIGS. 2 and 7, the unit 17 is composed of a fluid conveying pipe 17A extending transversely to the direction in which the assembly 1B is supplied and a plurality of fluid blowing holes 17B made in this pipe 17A.

The fluid conveying pipe 17A has a hollow interior and will permit the passage of a fluid therethrough at a pressure higher than one atmosphere. In the embodiment under discussion, the fluid conveying pipe 17A is shown to have a generally circular cross section but the cross-sectional shape of this pipe is not limited to a circle and may be rectangular or elliptical.

The fluid blowing holes 17B are disposed in such a manner that a fluid will be blown against the assembly 1B' in a direction in which its slack will protrude in the way already described above (ie, in the direction of arrow F in FIGS. 2 and 7).

As in the case of thin film adjusting unit 16, air is typically used as a fluid in the film projecting unit 17. Alternatively, gases such as inert gases or liquids such as water and oil may be used as fluids.

As described above, in the laminator of the present invention, the thin film projecting unit 17 which adjusts the slack assembly 1B' to project in a direction in which it is brought into intimate contact with the thermocompression roller 11 is mounted in the laminator body 8 (or support member 7 or front-stage conveyor 14) in an area near the assembly 1B'. This arrangement enables the assembly 1B' to become slack in a direction in which it can be reliably brought into intimate contact with the thermocompression roller 11 and a particularly notable advantage that results from this fact is that the trailing edge of the assembly 1B can be reliably sucked onto the rotary vacuum plate 13. Consequently, the trailing edge of the assembly 1B can be thermocompression laminated over the conductive layer on the insulating substrate 12 in a reliable manner without developing any wrinkles or other surface defects.

In the present invention, the thin film adjusting unit 16 or thin film projecting unit 17 may be constructed of a plurality of fluid blowing nozzles that are provided transversely to the direction of the supply of assembly 1B and through which a fluid will be blown against the assembly 1B in such a manner that it will be adjusted or allowed to project in the appropriate direction defined in the preceding paragraphs.

Alternatively, the adjusting unit 16 or projecting unit 17 may be constructed of a suction pipe extending transversely to the direction in which the assembly 1B is supplied and a plurality of suction holes that are made in this pipe and through which a vacuum is drawn to have the assembly 1B adjusted or project in the already defined appropriate direction.

If desired, each of the units 16 and 17 may be constructed of a projecting member that enables the assembly 1B to be adjusted or project in the specified appropriate direction.

In the present invention, the film adjusting unit 16 may serve as the film projecting unit 17, or vice versa.

A substrate guide member 18 is mounted on the laminator body 8 (or rear-stage conveyor 15) in an area between the thermocompression roller 11 and a transport roller 15A in the rear-stage conveyor 15. This guide member 18 is so constructed that the substrate 12 over which the assembly 1B has been thermocompression laminated will be guided from the laminating position to where the transport rollers 15A and 15B are positioned. As shown specifically in FIG. 6, guide member 18 may be in an interdigital form of bars that extend in the direction of conveyance of the substrate 12 and which are arranged transversely to that direction of conveyance. The interdigital guide member 18 is capable of guiding the substrate 12 smoothly by reducing the area of contact and, hence, the frictional resistance with the substrate 12.

The advantage of incorporating the substrate guide member 18 between the thermocompression roller 11 and a transport roller 15A in the rear-stage conveyor 15 is obvious when the substrate 12 is thin because it can be guided and conveyed to transport rollers 15A and 15B in a reliable manner without sagging at the leading edge after the assembly 1B has been laminated to each of its sides by thermocompression. This is effective in preventing the occurrence of troubles in the rear-stage conveyor 15 (or the substrate transport path). The effectiveness of the substrate guide member 18 is particularly great in the laminator of the embodiment under discussion, in which the thermocompression roller 11 is shifted from the position indicated by dashed line 11' to the one indicated by the solid line before temporary bonding of the assembly 1B is started. This shifting results in the creation of a considerable space between the roller 11 and transport roller 15A but the substrate 12 can travel through this space smoothly by virtue of guidance by the member 18.

In the present invention, the substrate guide member 18 may be formed of a screen or a solid plate.

The method of laminating the assembly 1B by thermocompression with the laminator of the embodiment being discussed is hereinafter described briefly.

In the first step, the leading edge of the assembly 1B which has been separated from the protective film 1A on the peeling roller 3 is manually positioned between the sub-vacuum plate 9 and the cutting unit 10.

In the next step, the insulating substrate 12 is conveyed over transport rollers 14A and 14B in the front-stage conveyor 14. When the leading edge of the substrate 12 reaches the temporary bonding position, the leading edge of the assembly 1B is sucked onto the surface of the sub-vacuum plate 9. Thereafter, the drive source 9A is actuated to move the sub-vacuum plate 9 away from the pathway of the supply of assembly 1B so that the leading edge of the assembly will be sucked to the temporary bonding portion 6D. As it is sucked to the main vacuum plate 6 and the temporary bonding portion 6D, the assembly 1B undergoes adjustment by the thin film adjusting unit 16 so that the leading edge of the assembly can be reliably sucked to the temporary bonding portion 6D. When the operation is continuous, the leading edge of the assembly 1B that has been cut with the cutting unit 10 is sucked to the temporary bonding portion 6D.

Subsequently, the drive source 7A is actuated to allow the main vacuum plate 6 to be moved toward the substrate 12. As a result of this movement, the leading edge of the assembly 1B that has been sucked to the temporary bonding portion 6D is temporarily bonded to the conductive layer on the insulating substrate 12 by thermocompression.

After the leading edge of the assembly 1B has been temporarily bonded to the substrate 12, the operation of sucking by the main vacuum plate 6 and temporary bonding portion 6D is turned off and the drive source 7A is actuated to cause each of the main vacuum plate 6 and temporary bonding portion 6D to move away from the temporary bonding position As already mentioned, the cutting unit 10 is secured to the laminator body 8, so that the drive source 7A can be reduced in size or its driving capability can be enhanced to achieve rapid operation of the laminator.

In a subsequent step, the thermocompression rollers 11 are shifted from the position indicated by the dashed line 11' to the temporary bonding position indicated by the dashed line. As the rollers 11 are rotated over both sides of the insulating substrate 12 with the leading edge of the assembly 1B being temporarily bonded thereto, said assembly is thermocompression laminated to the conductive layer on both sides of the substrate 12. In this step, the operation of sucking by the main vacuum plate 6, temporary bonding portion 6D and sub-vacuum plate 9 is all turned off, so that each of the thermocompression rollers 11 will be automatically supplied with the assembly 1B from the feed roller 2 by the rotating force of rollers 11 and the retaining force provided by the rollers 11 and the substrate 12.

When a given amount of assembly B has been laminated on the substrate 12 by thermocompression, the action of sucking by the main vacuum plate 6 and rotary vacuum plate 13 is started and the drive source 7A is actuated to allow the assembly 1B to be supplied to the substrate 12 as it is sucked by the main vacuum plate 6. The supply speed of the assembly 1B is so set as to be faster than the speed at which it is thermocompression laminated over the substrate 12 by rollers 11 (or the peripheral speed of the rollers 11).

After the supply of the assembly 1B, the sucking action of the main vacuum plate 6 is turned off and the drive source 7A is actuated to allow the main vacuum plate 6 to move away from the substrate 12. At the same time, the sucking action of the sub-vacuum plate 9 is started and the plate is brought close to the supply path of assembly 1B so that it will suck and retain the trailing edge (area to be cut) of the assembly. As a result of this sucking step, a slack assembly 1B' can be formed between the sub-vacuum plate 9 and the rotary vacuum plate 13. The trailing and leading edges of the slack assembly 1B' as seen in the direction of its supply are adjusted by the thin film adjusting unit 17 in such a manner that they are reliably sucked into the lower sucking portion 9b of the sub-vacuum plate 9 and the rotary vacuum plate 13, respectively.

While it is held in this state, the assembly 1B is cut at its trailing edge with the cutter unit 10 to provide a segment of a predetermined size that corresponds to the size of the substrate 12.

Subsequently, the training edge of the so cut assembly 1B is sucked by the rotary vacuum plate 13, which then rotates at a speed slightly slower than that of the thermocompression roller 11 and imparts an appropriate amount of tension to that part of the thin film which is defined by the area where it is laminated by rollers 11 and its trailing edge. As a result, the trailing edge of the assembly 1B can be laminated onto the conductive layer on the insulating substrate 12 without developing any surface defects such as wrinkles.

After the assembly 1B has been laminated by thermocompression, the substrate 12 is conveyed, without any troubles, past the substrate guide member 18 to be carried through the transport rollers 15A and 15B in the rear-stage conveyor 15 by the rotating force of the thermocompression rollers 11. The substrate 12 is further transferred from the rear-stage conveyor 15 to an adjacent exposure unit.

While the present invention has been described above in detail with reference to a specific embodiment, it should be understood that this is not the only embodiment of the invention and that various modifications can be made without departing from the spirit and scope of the present invention. For instance, the sub-vacuum plate 9 may be composed of two independently controlled plates, one plate being used to have leading edge of the assembly 1B (as seen in the direction of its supply) sucked to the temporary bonding portion 6D, and the other plate being used as a holder of the cutting unit 10. In another application of the laminator of the present inventon, the substrate 12 is preheated in preparation for the lamination of the assembly 1B over the substrate with unheated compression rollers. The laminator of the present invention can also be employed in attaching a protective film to the surface of a decorative laminated sheet used as a construction material.

The present invention provides a laminator by which a continuous thin film is cut to a predetermined size and laminated over a substrate, wherein a thin film supply member for supplying said continuous thin film to the substrate and a temporary bonding member by which the leading edge of the thin film being supplied by said thin film supply member is bonded temporarily to the substrate are mounted on the laminator body via a support member that is movable toward or away from the substrate, a cutting unit for cutting said continuous thin film to a predetermined size being secured to the laminator body in an area near the pathway of thin film supply between said temporary bonding member and the substrate. This arrangement contributes to a reduction in the weight of the support member and thereby enables it to be driven with a drive source of a small capacity of driving capability.

Figure 8:
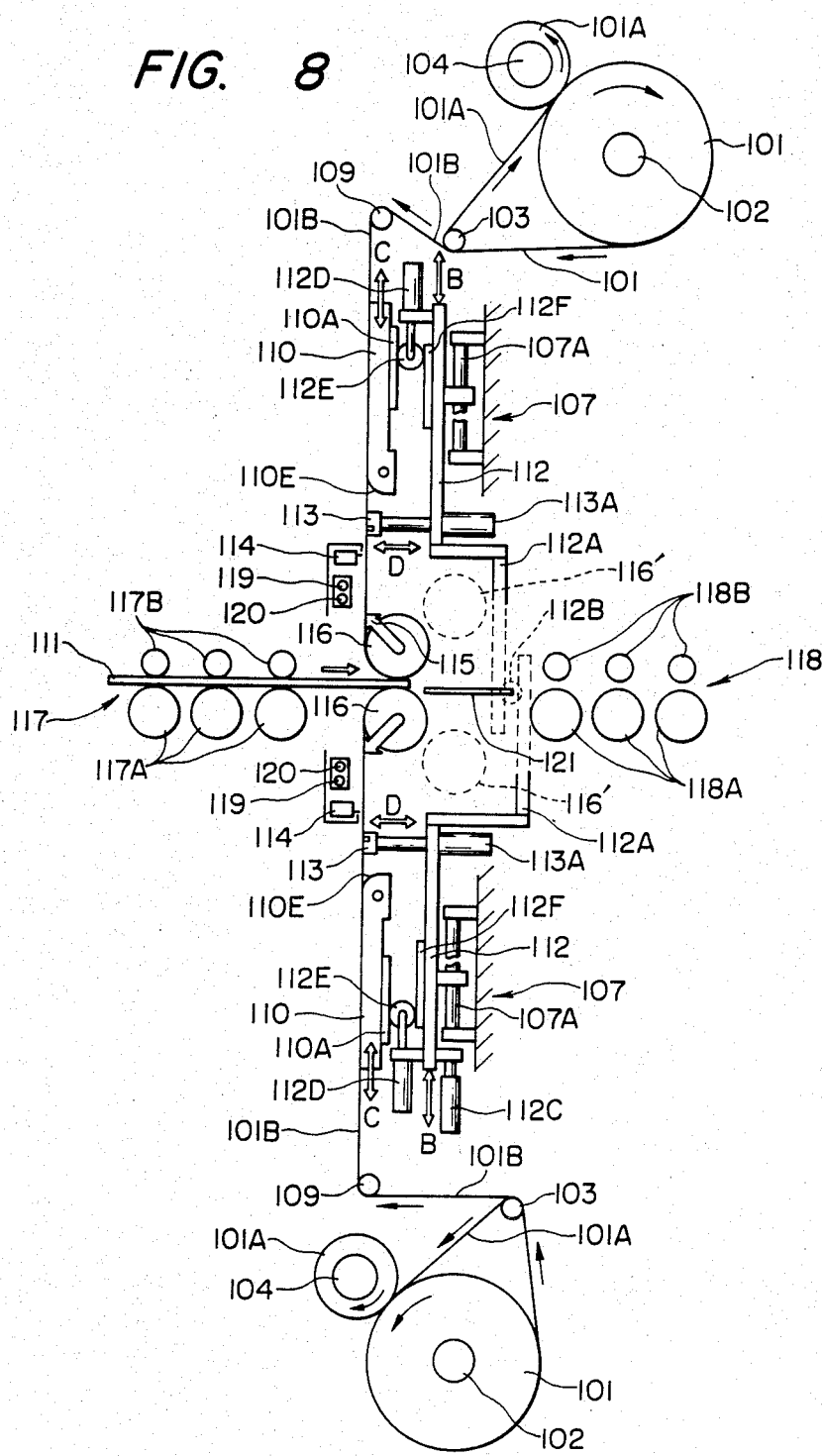
FIG. 8 is a schematic drawing of a laminator according to a second embodiment of the present invention.

A laminator according to another embodiment of the present invention is shown schematically in FIG. 8.

Figure 9:
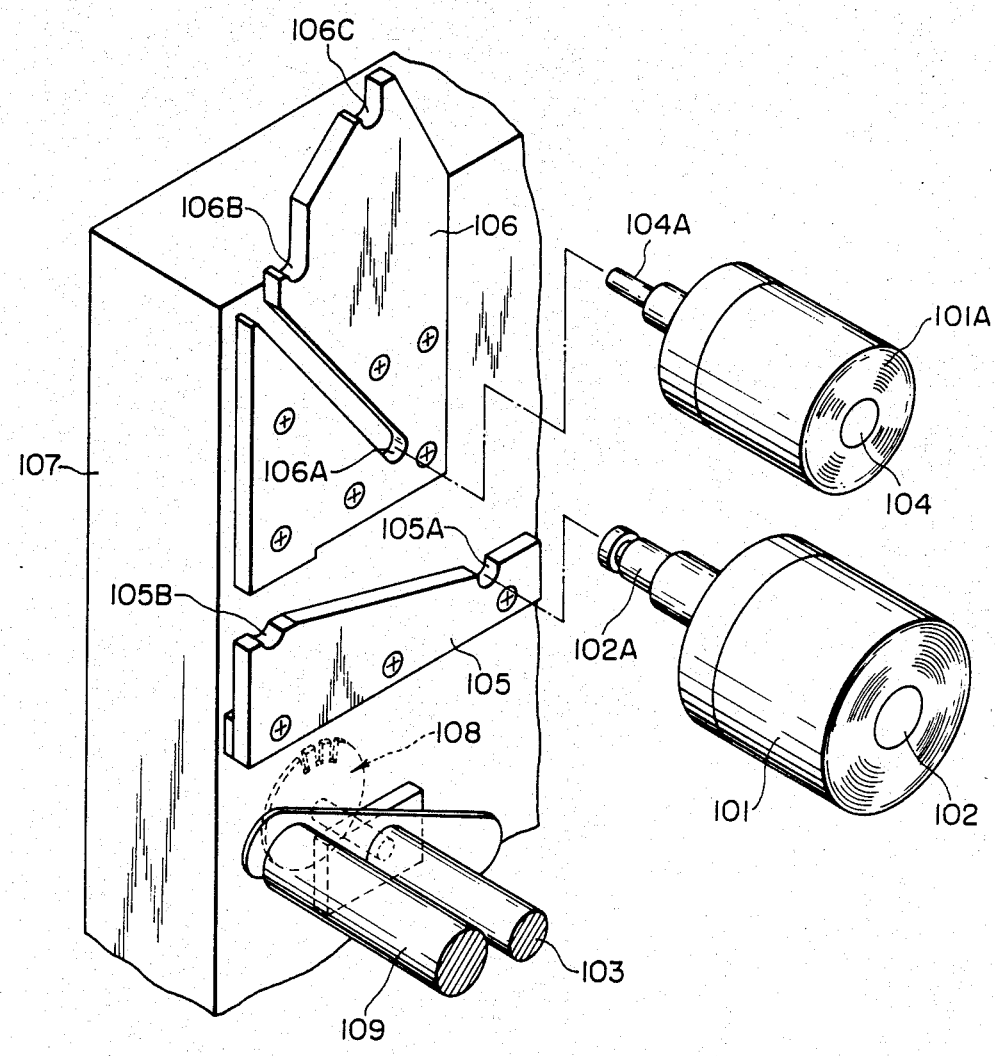
FIG. 9 is a perspective view showing the essential components of the laminator of FIG. 8.

FIG. 9 is a perspective view of the essential components of the laminator shown in FIG. 8. As is clear from FIG. 9, the feed roller 102 is supported on a roller support member 105 with the shaft 102A being fitted in an arc-shaped recess 105A. The roller support member 105 is attached to the outside of the cover frame of the laminator body 107 by suitable connection means such as screws (or with an adhesive).

The takeup roller 104 is supported on a roller support member 106 with the shaft 104A being fitted in a U-shaped recess 106A. The roller support member 106 is attached to the outside of the cover frame of the laminator body 107 in the same manner as the roller support member 105 is attached.

The roller support member 105 is provided at its left end (closer to the operator) with an arc-shaped recess 105B that serves as a place where the feed roller 102 is held temporarily. The roller support member 106 is provided at its right end (farther away from the operator) with arc-shaped recesses 106B and 106C each of which serves as a place where the takeup roller 104 is held temporarily.

The arc-shaped recesses 105B, 106B and 106C may be used as temporary roller-holding places in the following manner. If the assembly 101 is exhausted, it becomes necessary to replace the feed roller 102 with a new one that is fully loaded with the assembly 101. In this case, the shaft 104A of the takeup roller 104 is shifted from the U-shaped recess 106A to either the arc-shaped recess 106B or 106C. While the shaft 104A is fitted in 106B or 106C, the shaft 102A of the feed roller 102 is shifted from the arc-shaped recess 105A to the arc-shaped recess 105B in which it is temporarily fitted before it is dismounted from the roller support member 105. Subsequently, the shaft 102A of the new feed roller 102 is fitted temporarily in the arc-shaped recess 105B before it is brought into engagement with the arc-shaped recess 105A. Thereafter, the shaft 104A of the takeup roller 104 that has been fitted in the arc-shaped recess 106B or 106C in the roller support member 106 is slid into engagement with the U-shaped recess 106A.

Therefore, the arc-shaped recess 105B in the roller support member 105 which serves as a temporary holding place for the feed roller 102 and the arc-shaped recess 106B or 106C in the roller support member 106 which serves as a temporary holding place for the takeup roller 104 offer the advantage that the feed roller 102 and the takeup roller 104 which are both heavy-duty components can be mounted or dismounted by moving one roller in small steps without completely displacing the other roller. As a result, the overall efficiency of the operation of the laminator can be improved, with the attendant increase in the safety of operation.

Figure 10:
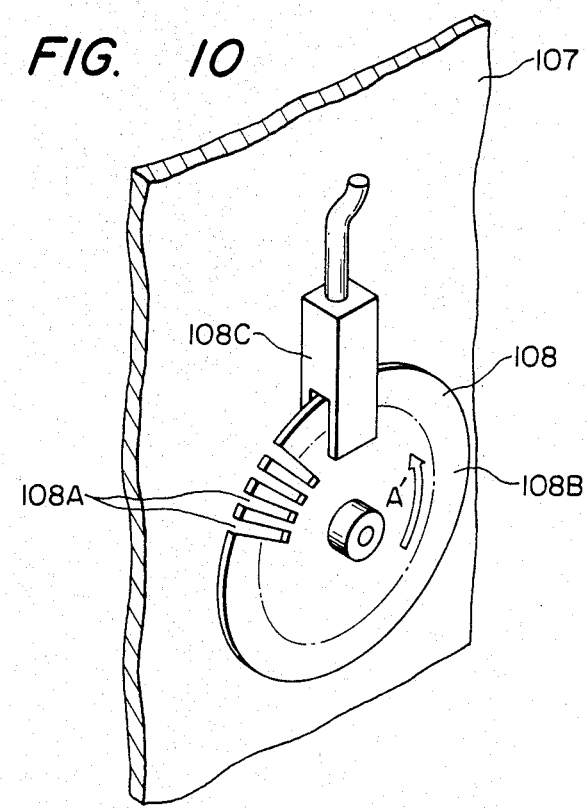
FIG. 10 is a perspective view showing on an enlarged scale the essential components of the thin film supply detector unit shown in FIG. 9.

As shown in FIG. 9 and FIG. 10 which is an enlarged perspective view of the essential components of FIG. 9, the separating roller 103 is provided at one end with a film supply detector unit 108. The separating roller 103 is provided in the pathway of the supply of the assembly 101, while the film supply detector unit 108 is provided in the pathway of the supply of the assemblies 101 and 101B that starts from the feed roller 102 and ends at the substrate. As the separating roller 103 rotates, the film supply detector unit 108 is rotated in the direction indicated by arrow A'. As shown in FIG. 10, the detector unit 108 is in the form of an encoder that is composed of a rotary disk 108B having a plurality of slits 108A on its periphery and a detector 108C which performs the detection of slits 108A. In short, the film supply detector 108 is so designed that it produces a predetermined output signal in accordance with the specific number of revolutions of the separating rollers 103. The rotary disk 108B may be made of an appropriate material such as a resin, a light metal or a metal alloy. The detector 108C is so designed that it detects the presence or absence of slits 108A by suitable means such as light or ultrasonic waves. The film supply detector 108 is mounted in the cover frame of the laminator body 107 in such a location that it will not impede the supply of assemblies 101 and 101B.

The film supply detector unit 108 is disposed in the pathway of the supply of assemblies 101 and 101B so that it is capable of monitoring the supply of these assemblies. Stated more specifically, the detector unit 108 serves to determine whether the assembly 101 or 101B is being supplied in the correct manner to attain such purposes as temporary thermocompression, thermocompression lamination and the cutting of the assembly 101B (for these individual operations, see the description that follows). If it is found that the assembly 101 or 101B is not being supplied correctly, the detector 108C will produce an output signal that actuates an alarm or some other indicator (not shown) to notify the operator of the abnormalcy. If necessary, the laminator can be automatically brought to a stop in response to the signal from the detector 108C. In this way, the film supply detector unit 108 serves to increase the yield of production of acceptable printed circuit boards.

The film supply detector unit 108 may be disposed in any part of the pathway of supply of assemblies 101 and 101B but, advantageously, it is mounted on the separating roller 103. Since this roller does not require any complicated construction and it does not have to be moved in any fashion other than rotation, it allows for easy mounting of the film supply detector unit 108.

Figure 11:
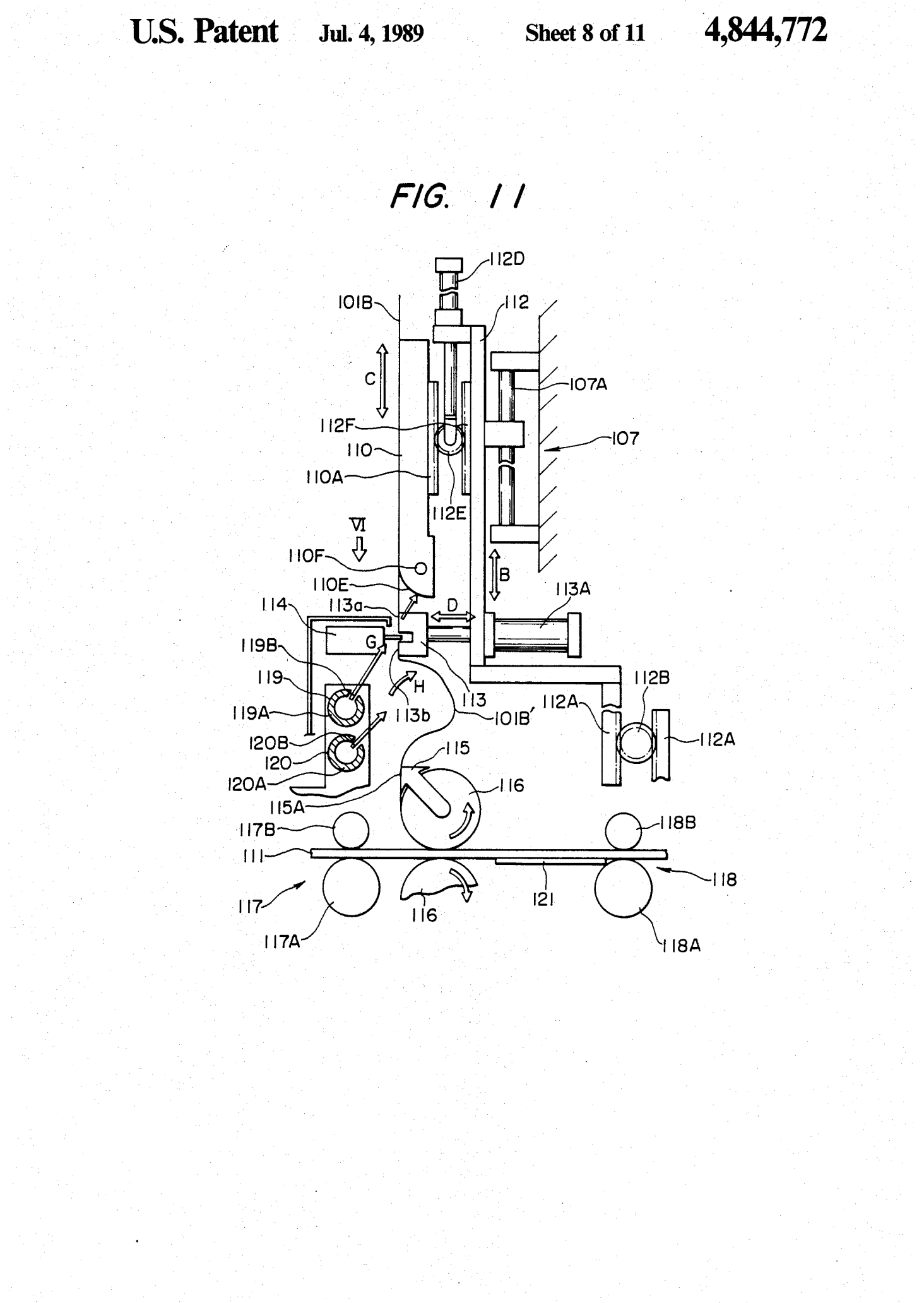

The main vacuum plate (film supply member) 110 is so designed that it allows the assembly 101B to be supplied from the roller 102 onto an electroconductive layer (e.g. Cu layer) on the surface of an insulating substrate 111. As shown in FIG. 8 and FIG. 11 which is an enlarged schematic view of the essential components of FIG. 8, the main vacuum plate 110 is mounted on a support member 112 that is movable toward or away from the insulating substrate 111 (viz., the support member 112 moves in the direction indicated by arrow B). The support member 112 is mounted on the laminator body (housing of the laminator) 107 in such a manner that it is capable of sliding along a guide member 107A in the direction of arrow B. The support member 112 is composed of two components which are arranged symmetrically with respect to the path along which the insulating substrate 111 is conveyed. The upper and lower components of support member 112 are operatively associated with each other by a rack-and-pinion mechanism such that the two components will be simultaneously moved toward or away from each other. Stated more specifically, the operative assocation of the two components of support member 112 is established by a rack 112A that is provided for each component 112A and a pinion 112B that engages this rack 112A. The power to operate the support member 112 is provided by a drive source 112C that is mounted on the lower component of support member 112. The drive source 112C (see FIG. 8) may be formed of an air cylinder. Alternatively, the drive source 112C may be formed of a hydraulic or electromagnetic cylinder, or a combination of a stepping motor and a transmission mechanism that transmits the displacement of the motor to the support member 112.

The main vacuum plate 10 is mounted on the support member 112 in such a manner that it will be moved toward or away from the insulating substrate 111 (ie, in the direction of arrow C). The main vacuum plate 110 is so constructed that it will be operated by a drive source 112D mounted on the support member 112 and a rack-and-pinion mechanism. The rack-and-pinion mechanism is composed of a pinion 112E mounted on the drive source 112D, a rack 112F mounted on the support member 112, and a rack 110A mounted on the main vacuum plate 110. The drive source 112D may be formed of any of the devices that are mentioned in connection with the drive source 112C.

The main vacuum plate 110 is constructed in the same manner as the vacuum plate 6 in the first embodiment.

A sub-vacuum plate (thin film retaining member) 113 is provided in proximity to the temporary bonding portion 110E, namely in the vicinity of the pathway of supply of assembly 101B between that portion and the insulating substrate 111. Although not shown, the sub-vacuum plate 113 is also provided with suction holes, and as shown in FIG. 11, it is composed of an upper sucking portion 113a and a lower sucking portion 113b to provide a U-shaped form, with the open end of the U-shaped recess corresponding to the position at which the assembly 101B is to be cut. The upper sucking portion 113a of the sub-vacuum plate 113 chiefly serves to have the leading edge of the assembly 101B sucked so that it is sucked (and retained) on the temporary bonding portion 110E. In order to enable the leading edge of the assembly 101B to be sucked onto the bonding portion 110E, the sub-vacuum plate 113 is mounted on the support member 112 and operated with a drive source 113A which may be in the form of an air cylinder that is movable toward or away from the pathway of the supply of assembly 101B (ie, moved in the direction of arrow D).

The lower sucking portion 113b of the sub-vacuum plate 113 is so constructed that after a continuous form of the assembly 101B has been cut with a cutting unit 114, the resulting segment of assembly is sucked at its training edge and retained within the pathway of the supply of assembly 101B. This lower sucking portion 113B is also constructed in such a way that after the start of thermocompression lamination, a slack will from in that portion of the assembly 101B which is situated between 1013b and a rotary vacuum plate 15 (namely, a slack assembly 101B' will be formed) as shown in FIG. 11. The slack assembly 101B' can be formed by supplying the assembly 101B on the main vacuum plate 110 at a speed that is so controlled as to be faster than the peripheral speed of a thermocompression roller 116 (viz., the speed of thermocompression lamination). Although not shown, the speed at which the assembly is supplied on the main vacuum plate 110 and the peripheral speed of the roller 116 are controlled by a sequence control circuit.

As in the case of drive source 112C, the drive source 113A for sub-vacuum plate 113 may be in the form of a hydraulic cylinder or the like in place of an air cylinder.

The cutter unit 114 is provided in the laminator body 107 in the pathway of the assembly 101B that is supplied from the temporary bonding portion 110E to the insulating substrate 111 (more exactly, from the bonding portion 110E to the rotary vacuum plate 115). Stated more specifically, the cutter unit 114 is disposed to face the cutting position of the trailing edge of the assembly 101B that has been supplied to the sub-vacuum plate 113. The cutter unit 114 is mounted on the side of a front-stage substrate conveyor 117 (or it may be formed as part of this front-stage conveyor). The cutter unit 114 is so constructed that the assembly which is continuously supplied on the main vacuum plate 110 is cut to a predetermined length in accordance with the dimensions of the insulating substrate 111.

The construction of the cutter unit 14 is the same as that shown in 4.

In the above-described laminator of the present invention, the main vacuum plate 110 and sub-vacuum plate 113 are mounted on the support member 112, which in turn is mounted on the laminator body 107 in such a manner that it is capable of being moved toward or away from the insulating substrate 111, and the cutting unit 114 for cutting the assembly 101B is secured to the laminator body 107 in an area near the pathway of supply of the assembly 101B between the temporary bonding portion 110E and the insulating substrate 111. This arrangement is effective in reducing the weight of the members to be supported by the support member 112 and thereby allowing it ot be driven with the drive source 112C that may have a small driving capability (or capacity).

As shown in FIGS. 8 and 11, a thin film adjusting unit 119 is provided on the laminator body (or front-stage conveyor 117 or support member 112) in an area near the pathway of thin film supply, or the pathway of the movement of the temporary bonding portion 110E of the main vacuum plate 110 as in the first embodiment. The adjusting unit 119 is constructed in the same manner. This adjuster is compoed of a fluid conveying pipe 119A that extends transversely to the direction in which the assembly 101B is supplied and a plurality of fluid blowing holes 119B made in this pipe 119A.

As shown in FIGS. 8 and 11 a thin film projecting unit 120 is mounted in the laminator body 107 (or front-stage conveyor 117 or support member 112) in an area near the assembly 101B (or 101B') that is supplied between the lower sucking portion 113B of the sub-cacuum plate 113 and the rotary vacuum plate 115. This projecting unit 120 is constructed in the same manner as in the first embodiment. The unit 120 is composed of a fluid conveying pipe 120A extending transversely to the direction in which the assembly 110B is supplied and a plurality of fluid blowing holes 120B made in this pipe 120A.

The method of laminating the assembly 101B by thermocompression with the laminator of the embodiment being discussed is hereinafter described briefly with reference to FIGS. 8 and 11 and FIGS. 12 to 14 that show on an enlarged scale the essential components of the laminator according to individual steps.

In the first step, the leading edge of the assembly 101B which has been separated from the protective film 101A on the separating roller 103 is manually positioned between the sub-vacuum plate 113 and the cutting unit 114.

Figure 12:
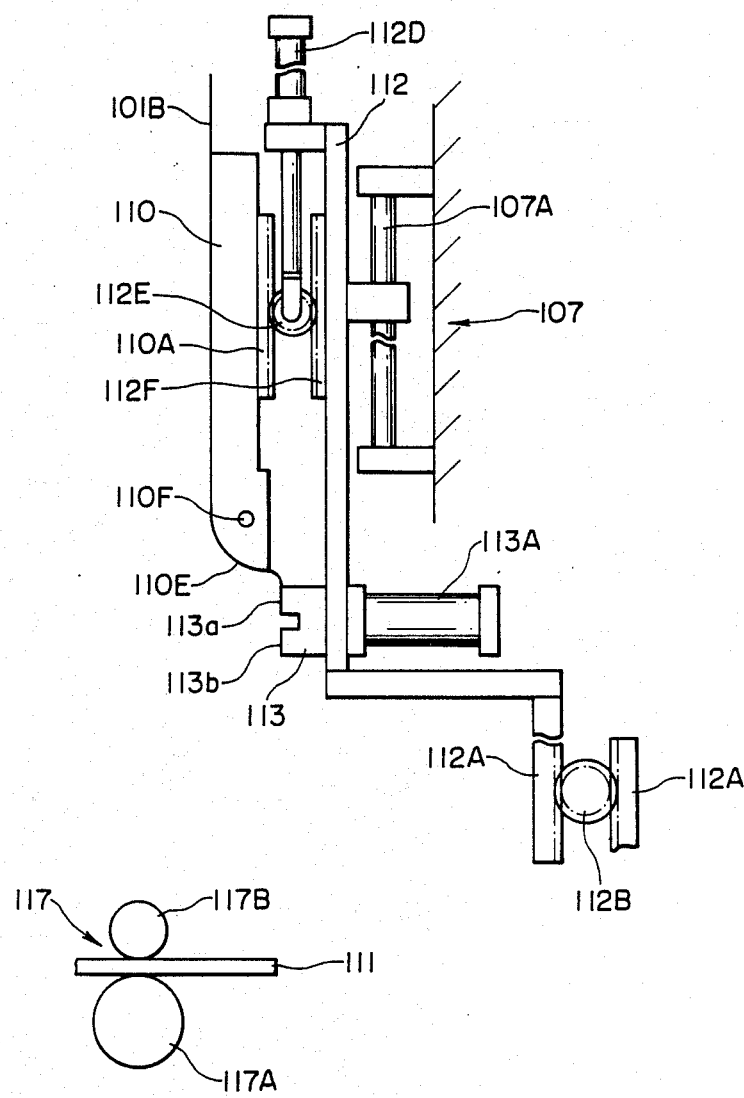
FIGS. 12 to 14 are diagrammatic views showing on an enlarged scale the essential components of the laminator of FIG. 8 according to individual steps of a method of effecting thermocompression lamination with this laminator.

In the next step, the insulating substrate 111 is conveyed over transport rollers 117A and 117B in the front-stage conveyor 117. When the leading edge of the substrate 111 reaches the temporary bonding position, the leading edge of the assembly 101B is sucked onto the surface of the sub-vacuum plate 113. Thereafter, the drive source 113A is actuated to move the sub-vacuum plate 113 away from the pathway of the supply of assembly 101B so that the leading edge of the assembly will be sucked to the temporary bonding portion 110E as shown in FIG. 12. As it is sucked to the main vacuum plate 110 and the temporary bonding portion 110E, the assembly 101B undergoes adjustment by the thin film adjusting unit 119 so that the leading edge of the assembly can be reliably sucked to the temporary bonding portion 110E. When the operation is continuous, the leading edge of the assembly 101B that has been cut with the cutting unit 114 is sucked to the temporary bonding portion 110E.

Figure 13:
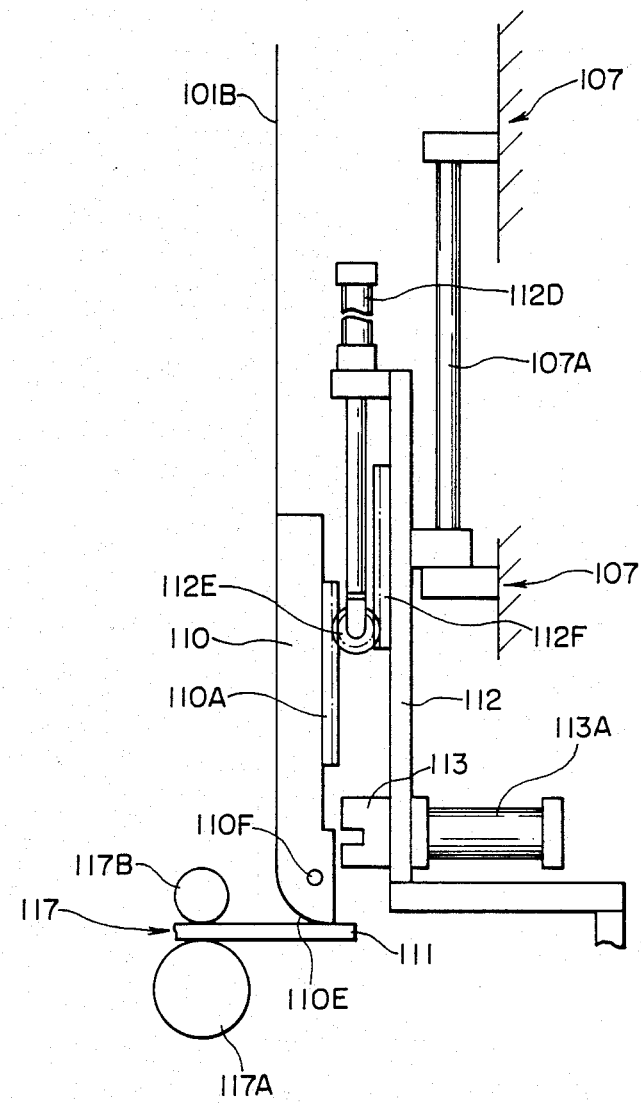

Subsequently, the drive source 112C is actuated to move the support member 112 so that the main vacuum plate 110 and sub-vacuum plate 113 will come close to the insulating substrate 111. At the same time, the drive source 112D is actuated to cause further movement of the main vacuum plate 110 with respect to the support member 112 and, as shown in FIG. 13, the leading edge of assembly 101B that has been sucked to the temporary bonding portion 110E is temporarily bonded to the conductive layer on the insulating substrate 111 by thermocompression.

Figure 14:
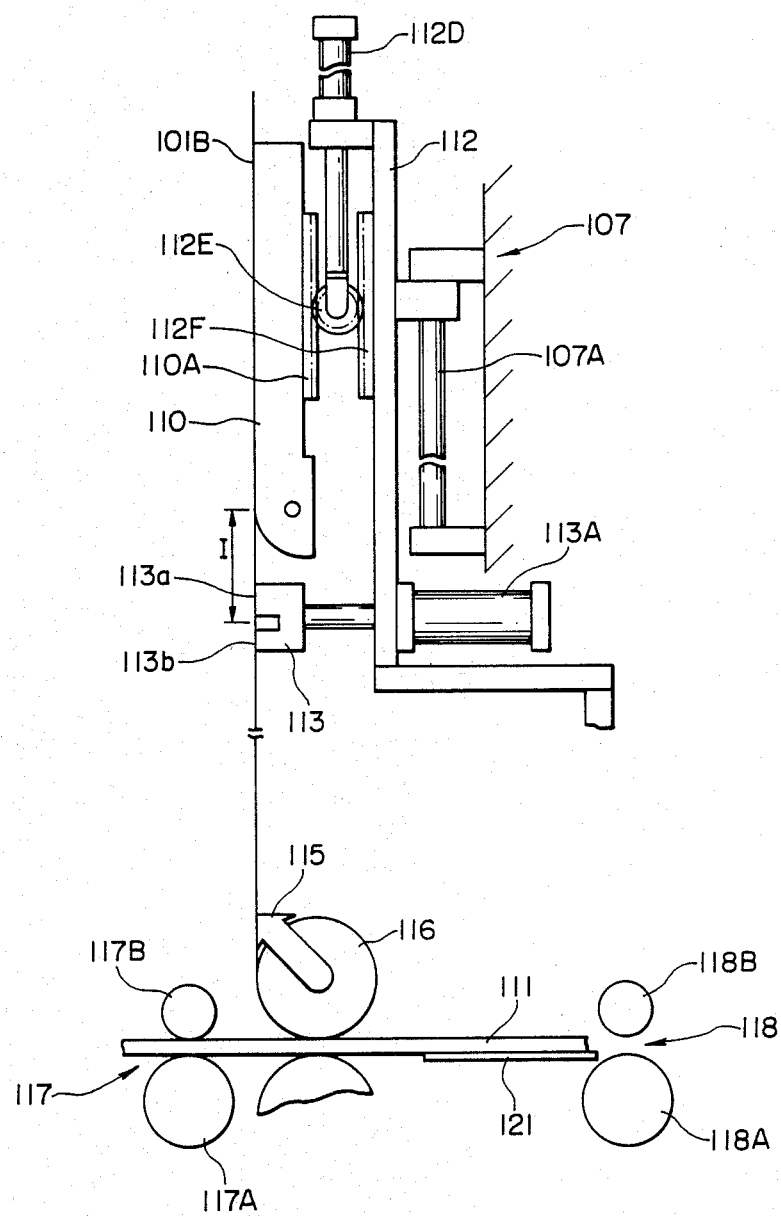

After the leading edge of the assembly 101B has been temporarily bonded to the substrate 111, the operation of sucking by the main vacuum plate 110 and temporary bonding portion 110E is turned off and, as shown in FIG. 14, the drive sources 112C and 112D are actuated to cause each of the main vacuum plate 110, temporary bonding portion 110E and sub-cacuum plate 113 to move away from the temporary bonding position. In this step, the main vacuum plate 110 and sub-vacuum plate 113 are moved by the drive source 112C farther away from the pathway of the supply of assembly 101B than when the sub-vacuum plate 113 is moved for allowing the assembly 101B to be sucked to the temporary bonding portion 110E as shown in FIG. 12. The amount of displacement to be effected in this step is proportional to the amount of slack to be imparted to the assembly 101B'. As already mentioned, the cutting unit 114 is secured to the laminator body 107, so that the drive source 112C for support member 112 can be reduced in size or its driving capability can be enhanced to achieve rapid operation of the laminator.[2]

In a subsequent step, the thermocompression rollers 116 are shifted from the position indicated by the dashed line 116' to the temporary bonding position indicated by the dashed line. As the rollers 116 ae rotated over both sides of the insulating substrate 111 with the leading edge of the assembly 101B being temporarily bonded thereto, said assembly is thermocompression laminated to the conductive layer on both sides of the substrate 111. In this step, the operation of sucking by the main vacuum plate 110, temporary bonding portion 110E and sub-vacuum plate 113 is all turned off, so that each of the thermocompression rollers 116 will be automatically supplied with the assembly 11B from the feed roller 116 by the rotating force of rollers 116 and the retaining force provided by the rollers 116 and the substrate 111.

When a given amount of assembly 101B has been laminated on the insulating substrate 111 by thermocompression, the action of sucking by the main vacuum plate 110, sub-vacuum plate 113 and rotary vacuum plate 115 is started substantially simultaneously. As a result, the drive source 112C is actuated to move support member 112 from the state shown in FIG. 14 and the assembly 101B is supplied to the substrate 111 as it is sucked by the main vacuum plate 110. At the same time, as shown in FIG. 11, the trailing edge of the assembly 101B (at which it is to be cut) is brought into registry with the cutting position of the cutter unit 114 by means of the lower sucking portion 113b of the sub-vacuum plate 113. The supply speed of the assembly 101B (or the moving speed of the support member 112) is so set as to be faster than the speed at which it is thermocompression laminated over the substrate 111 by rollers 116 (or the peripheral speed of the rollers 116).

As described above, according to the present invention, the main vacuum plate 110 and sub-vacuum plate 113 are mounted on the support member 112, which in turn is mounted on the laminator body 107 in such a manner that it will be moved toward or away from the insulating substrate 111. Because of this arrangement, the training edge of the assembly 101B (at which it is to be cut) is sucked by the sub-vacuum plate 113 substantially simultaneously with the sucking action of the main vacuum plate 110, and by moving the two vacuum plates 110 and 113 by means of the support member 112, the cutting position of the assembly 101B can be brought into registry with that of the cutter unit 114. This eliminates the chance of an unwanted slack of developing in the assembly 101B between the main vacuum platea 110 and the sub-vacuum plate 113. In other words, the distnace I (see FIG. 14) between the main vacuum plate 110 and the area of the sub-vacuum plate 113 on which the disk-shaped cutter 114C acts (ie, the U-shaped recess in plate 113) will remain unchanged even when the cutting position of the assembly 101B is brought into registry with that of the cutter unit 114 as shown in FIG. 11. As a result, exact alignment can be attained between the two cutting positions and the assembly 101B can be cut exactly according to the dimensions of the substrate 111 so as to increase the yield of successfully laminated products. In addition, as already mentioned, the cutting unit 114 is secured to the laminator body 107 so that the support member 112 on which the two vacuum plates 110 and 113 are mounted can be driven with the drive source 112C of a small capacity.

If, after the supply of assembly 101B, the position on which it is to be cut is brought again into registry with the cutting position of the cutter unit 114, a slack assembly 101B; can be formed between the sub-vacuum plate 113 and the rotary vacuum plate 115. The trailing and leading edges of the slack assembly 101B' as seen in the direction of its supply are adjusted by the thin film adjusting unit 120 in such a manner that they are reliably sucked onto the lower sucking portion 113b of the sub-cacuum plate 113 and the rotary vacuum plate 115, respectively.

While it is held in this state, the assembly 101B is cut at its trailing edge (ie, its cutting position) with the cutter unit 114 to provide a segment of a predetermined size that corresponds to the size of the insulating substrate.

Subsequently, the trailing edge of the so cut assembly 101B is sucked by the rotary vacuum plate 115, which then rotates at a speed that is slightly slower than that of the thermocompression roller 116 and the trailing edge of the assembly 101B is laminated onto the conductive layer on the substrate 111 by thermocompression. Since the rotary vacuum plate 115 is rotating at a speed that is slightly slower than that of the thermocompression roller 116, the assembly 1B travelling between the plate 115 and the roller 116 is given the necessary amount of tension to eliminate the chance of development of wrinkles and other surface defects in the assembly 101B.

After the assembly 101B has been laminated by thermocompression, the substrate 111 is conveyed, without any troubles, past the substrate guide member 121 to be carried through the transport rollers 118A and 118B in the rear-stage conveyor 118 by the rotating force of the thermocompression rollers 116. The substrate 111 is further transferred from the rear-stage conveyor 118 to an adjacent exposure unit.

While the present invention has been described above in detail with reference to specific embodiments, it should be understood that this is not the only embodiment of the invention and that various modifications can be made without departing from the spirit and scope of the present invention.

The present invention provides a laminator by which a continuous thin film is cut to a predetermined size and laminated over a substrate, wherein a thin film supply-member for supplying said continuous thin film to the substrate is mounted on a support member, said support member being mounted on the laminator body in such a manner that it is movable toward or away from the substrate, a thin film retaining member by which the portion of said continuous thin film to be cut is retained within the pathway of thin film supply being also mounted on said support member, the continuous thin film retained on said thin film retaining member being cut to a predetermined size with a cutting unit, said cutting unit being secured to the laminator body in an area near the pathway of thin film supply between said thin film supply member and said substrate. In this laminator, both the thin film supply member and the thin film retaining member are mounted on the support member, and while the thin film is retained on the thin film supply member it is retained by the thin film retaining member to be situated on the proper position for cutting with the cutting unit. Because of this arrangement, the thin film between the thin film supply member and the thin film retaining member will not slack in any part thereof and the cutting position of the thin film can be brought into exact alignment with that of the cutting unit. In addition, the cutting unit is secured to the laminator body, so that the weight of the support member is sufficiently reduced to enable it to be driven with a drive source of a small capacity or driving capability.

The fact that the cutting position of the thin film can be brought into exact alignment with that of the cutting unit has the additional advantage of allowing the thin film to be cut for the correct dimensions and thereby increasing the yield of acceptable products.

We claim:

1. A laminator for cutting a continuous thin film in a predetermined size and laminating same over a substrate, comprising:
   a stationary laminator body;
   a thin film supply means for supplying said continuous thin film to the substrate;
   a temporary bonding means for temporarily bonding a leading end of said continuous thin film within a pathway of thin film supply;
   a support means for supporting said thin film supply means and said temporary bonding means in such a manner that said thin film supply means and said temporary bonding means are movable toward or away from said substrate, said support means being mounted on said stationary laminator body;
   a cutting means for cutting the continuous thin film in a predetermined size, said cutting means being secured to said laminator body in an area near the pathway of thin film supply between said thin film supply means and said substrate.

2. The laminator according to claim 1, wherein said cutting includes a guide member that extends across the thin film generally orthogonal to a direction in which the thin film is supplied, a moving member that moves along said guide member, and a disc-shaped cutter that is mounted on said moving member.

3. The laminator according to claim 2, wherein said cutting means further includes a rack mounted along the guide member of said cutting means in an area near to said guide member, said moving member being provided with a pinion that meshes with said rack to rotate said disc-shaped cutter.

4. The laminator according to claim 3, wherein said moving member of said cutting means is so constructed as to move the guide member by means of a fluid.

5. The laminator according to claim 1, wherein said cutting means includes a cutter having a blade that is equal to or larger than a transversal dimension of the thin film which is generally orthogonal to a direction in which the thin film is supplied.

6. The laminator according to claim 1, wherein said cutting means includes a cutter having a blade that is coated with polytetrafluoroethylene.

7. A laminator for cutting a continuous thin film in a predetermined size and laminating same over a substrate, comprising:
   a stationary laminator body;
   a thin film supply means for supplying said continuous thin film to the substrate;
   a first support means for supporting said thin film supply means in such a manner that said thin film supply means is movable toward or away from said substrate;
   a thin film retaining means for retaining the continuous thin film to be cut within a pathway of thin film supply;
   a second support means for supporting said thin film retaining means in such a manner that said thin film retaining means is movable toward or away from said substrate, said second support means being supported relative to said stationary laminator body; and
   a cutting means for cutting the continuous thin film in a predetermined size, said thin film retaining means holding said continuous thin film, said cutting means being secured to said laminator body in an area near the pathway of thin film supply between said thin film fupply means and said substrate.

8. The laminator according to claim 7, wherein said first support means is supported by said second support means.

9. The laminator according to claim 7, wherein said thin film supply means includes a temporary bonding means for temporarily bonding a leading end of the continuous thin film within the pathway of thin film supply.

10. The laminator accordingto claim 7, wherein said cutting means includes a guide member that extends across the thin film generally orthogonal to a direction in which the thin film is supplied, a moving member that moves along said guide member, and a disc-shaped cutter that is mounted on said moving member.

11. The laminator according to claim 10, wherein said cutting means further includes a rack mounted along the guide member of said cutting means in an area near to said guide member, said moving member being provided with a pinion that meshes with said rack to rotate said disc-shaped cutter.

12. The laminator according to claim 11, wherein said moving member of said cutting means is so constructed as to move the guide member by means of a fluid.

13. The laminator according to claim 7, wherein said cutting means includes a cutter having a member that is equal to or larger than a transversal dimension of the thin film which is generally orthogonal to a direction in which the thin film is supplied.

14. The laminator according to claim 7, wherein said cutting means includes a cutter having a blade that is coated with polytetrafluoroethylene.

15. The laminator according to claim 1, further comprising a thin film end adjusting means for adjusting the leading end of the thin film in a direction in which the leading end of the thin film is brought into intimate contact with said temporary bonding means.

16. The laminator according to claim 7, wherein said thin film supply means includes a plurality of nozzles for sucking the thin film, said temporary bonding means being formed integrally with said thin film supply means, said temporary bonding means having an arcuate contact surface.

17. The laminator according to claim 15, wherein said thin film adjusting means includes a fluid delivery pipe extending in a transversal direction of the thin film supply, and fluid injection holes for injecting fluid in order to adjust the thin film.

18. The laminator for cutting a continuous thin film in a predetermined size and laminating same over a substrate, comprising:
- a stationary laminator body;
- a thin film supply means for supplying said continuous thin film to the substrate;
- a temporary bonding means for temporarily bonding a leading end of said continuous thin film within a pathway of thin film supply;
- a support means for supporting said thin film supply means and said temporary bonding means in such a manner that said thin film supply means and said temporary bonding means are movable toward or away from said substrate, said support means being mounted on said stationary laminator body;
- a bonding roller means for bonding the thin film temporarily bonded to the substrate by means of said temporary bonding means;
- a thin film slacking means for imparting a slack to a trailing end portion of the thin film by feeding the thin film at a speed higher than that of the bonding roller means just after a commencement of thin film bonding by means of said bonding roller means; and
- a thin film end adjusting means for adjusting the leading end of the thin film in a direction in which the leading end of the thin film is brought into intimate contact with said temporary bonding means, said adjusting means being located in an area near a pathway of movement of said temporary bonding means.

19. The laminator according to claim 18, further comprising a thin film projecting means for projecting the thin film in a direction in which the slacked part of the thin film formed by said slacking means is brought into contact with said bonding roller means, said thin film projecting means being located in the area near the pathway of movement of said temporary bonding means.

20. The laminator according to claim 18, wherein said thin film supply means includes a plurality of nozzles for sucking the thin film, said temporary bonding means being formed integrally with said thin film supply means, said temporary bonding means having an arcuate contact surface.

21. The laminator according to claim 18, wherein said thin film supply means includes a fluid delivery pipe extending in a transversal direction of the thin film, and fluid injection holes for injecting fluid in order to adjust the thin film.

22. The laminator according to claim 18, wherein said thin film adjusting means includes a plurality of nozzles for injecting fluid toward the thin film, said plurality of nozzles are aligned in parallel with the transversal direction of said thin film.

23. The laminator according to claim 19, wherein said thin film projecting means includes a plurality of nozzles for injecting fluid toward the thin film, said plurality of nozzles are aligned in parallel with the transversal direction of said thin film.

24. A laminator for cutting a continuous thin film in a predetermined size and laminating same over a substrate, comprising:
- a stationary laminator body;
- a thin film supply means for supplying said continuous thin film to the substrate;
- a first support means for supporting said thin film supply means in such a manner that said thin film supply means is movable toward or away from said substrate;
- a thin film retaining means for retaining the continuous thin film to be cut within a pathway of thin film supply;
- a second support means for supporting said thin film retaining means in such a manner that said thin film retaining means is movable toward or away from said substrate, said second support means being supported relative to said stationary laminator body;
- a cutting means for cutting the continuous thin film in a predetermined size, said thin film retaining means holding said continuous thin film, said cutting means being secured to said laminator body in an area near the pathway of thin film supply between said thin film supply means and said substrate;
- a temporary bonding means for temporarily bonding a leading end of said thin film within a pathway of thin film supply;
- a bonding roller means for bonding the film temporarily bonded to the substrate by means of said temporary bonding means;
- a thin film slacking means for imparting a slack to a trailing end portion of the thin film by feeding the fhin film at a speed higher than that of the bonding roller means just after a commencement of thin film bonding by means of said bonding roller means; and
- a thin film end adjusting means for adjusting the leading end of the thin film in a direction in which the leading end of the thin film is brought into intimate contact with said temporary bonding means, said adjusting means being located in an area near a pathway of movement of said temporary bonding means.

25. The laminator according to claim 24, further comprising a thin film projecting means for projecting the thin film in a direction in which the slacked part of the thin film formed by said slacking means is brought into contact with said bonding roller means, said thin film projecting means being located in the area near the pathway of movement of said temporary bonding means.

26. The laminator according to claim 24, wherein said thin film supply means includes a plurality of nozzles for sucking the thin film, said temporary bonding means being formed integrally with said thin film supply means, said temporary bonding means having an arcuate contact surface.

27. The laminator according to claim 24, wherein said thin film supply means includes a fluid delivery pipe extending in a transversal direction of the thin film, and fluid injection holes for injecting fluid in order to adjust the thin film.

28. The laminator according to claim 24, wherein said thin film adjusting means includes a plurality of nozzles for injecting fluid toward the thin film, said plurality of nozzles are aligned in parallel with the transversal direction of said thin film.

29. The laminator according to calim 25, wherein said thin film projecting means includes a plurality of nozzles for injecting fluid toward the thin film, said plurality of nozzles are aligned in parallel with the transversal direction of said thin film.

* * * * *